United States Patent
Pullela et al.

(10) Patent No.: US 8,165,538 B2
(45) Date of Patent: Apr. 24, 2012

(54) SYSTEMS AND METHODS FOR IMPLEMENTING A HARMONIC REJECTION MIXER

(75) Inventors: Rajasekhar Pullela, Colton, CA (US); Dmitriy Rozenblit, Irvine, CA (US); Hamid Firouzkouhi, Mission Viejo, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 762 days.

(21) Appl. No.: 12/145,599

(22) Filed: Jun. 25, 2008

(65) Prior Publication Data

US 2009/0325510 A1    Dec. 31, 2009

(51) Int. Cl.
*H04B 1/04* (2006.01)
*H04B 15/00* (2006.01)

(52) U.S. Cl. ............. 455/114.1; 455/114.2; 455/313; 455/317; 455/318; 455/326; 455/293; 455/255; 455/205; 455/208

(58) Field of Classification Search ............ 455/114.1, 455/114.2, 313, 317, 318, 326, 293, 255, 455/205, 208
See application file for complete search history.

(56) References Cited

U.S. PATENT DOCUMENTS

| | | | | |
|---|---|---|---|---|
| 7,130,604 | B1 * | 10/2006 | Wong et al. | 455/302 |
| 7,605,669 | B2 * | 10/2009 | Pullela et al. | 331/45 |
| 7,652,542 | B2 * | 1/2010 | Matsuno | 331/37 |
| 2004/0005869 | A1 | 1/2004 | See et al. | |
| 2004/0142673 | A1 | 7/2004 | Asayama et al. | |
| 2005/0085206 | A1 * | 4/2005 | Lee et al. | 455/255 |
| 2005/0233723 | A1 | 10/2005 | Gomez et al. | |
| 2006/0111051 | A1 * | 5/2006 | Barink et al. | 455/70 |
| 2006/0205370 | A1 | 9/2006 | Hayashi et al. | |
| 2007/0026835 | A1 * | 2/2007 | Yamaji et al. | 455/318 |
| 2007/0042743 | A1 | 2/2007 | Ali et al. | |
| 2007/0072575 | A1 * | 3/2007 | Sowlati et al. | 455/318 |
| 2008/0100755 | A1 | 5/2008 | Wang et al. | |

OTHER PUBLICATIONS

Weldon et al., "A 1.75-GHz Highly Integrated Narrow-band CMOS Transmitter with Harmonic-Rejection Mixers", IEEE Journal of Solid-State Circuits, vol. 36, No. 12, Dec. 2001.
White Paper: Skyworks Solutions, Inc., "The Polar Loop Transmitter for Quad-Band GSM, GPRS, and EDGE Applications", May 16, 2005.

* cited by examiner

*Primary Examiner* — Wen Huang
(74) *Attorney, Agent, or Firm* — Knobbe Martens Olson & Bear, LLP

(57) ABSTRACT

Various embodiments of systems and methods for generating local oscillator (LO) signals for a harmonic rejection mixer are provided. One embodiment is a system for generating local oscillator (LO) signals for a harmonic rejection mixer. One such system comprises a local oscillator, a divide-by-N frequency divider, a divide-by-three frequency divider, and a harmonic rejection mixer. The local oscillator is configured to provide a reference frequency signal. The divide-by-N frequency divider is configured to divide the reference frequency signal by a value N and provide an output signal. The divide-by-three frequency divider is configured to receive the output signal of the divide-by-N frequency divider and divide the output signal into three phase-offset signals. The harmonic rejection mixer is configured to receive the three phase-offset signals and eliminate third frequency harmonics.

18 Claims, 9 Drawing Sheets

SYSTEMS AND METHODS FOR IMPLEMENTING A HARMONIC REJECTION MIXER

BACKGROUND

Radio frequency (RF) transmitters are found in many one-way and two-way communication devices, such as portable communication devices, cellular telephones, personal digital assistants (PDAs) and other communication devices. An RF transmitter transmits using whatever communication methodology is dictated by the particular communication system within which it is operating. RF transmitters are often incorporated into devices that support transmission of voice or data at multiple frequency bands. Such RF transmitters typically employ an upconversion process to control the transmit frequency of the device. In general, the upconversion process involves super-imposing baseband information on a high frequency carrier signal.

Typically, an upconverter uses one or more mixers to upconvert a baseband signal or an intermediate frequency signal (e.g., a local oscillator (LO) signal) to an RF signal. A considerable problem with a conventional mixer used in an upconverter is that it generates undesirable noise. To suppress the noise, a local oscillator (LO) signal may be hard-switched or a square wave may be applied instead of a sinusoidal signal. As a result, the output signal may contain the modulated signal around the intermediate frequency ($\omega_{LO}$) and unwanted harmonics at odd harmonics, such as, third, fifth, and seventh harmonics. These harmonics create unwanted spurious power that may, for example, violate transmit mask requirements or may cause distortions in the transmitted output signal when they pass through output buffers or power amplifiers that may have non-linear operational characteristics. Therefore, it is desirable to remove these harmonics.

In a conventional mixer, passing $\omega_{LO}$ but rejecting the odd harmonics (e.g., $3\omega_{LO}$, $5\omega_{LO}$) typically requires a relatively high-Q filter. The filter requirements may be simplified by using a harmonic rejection mixer. A typical third harmonic rejection mixer obtains four signals ($A_{0°}, A_{60°}, A_{90°}, A_{150°}$) by squaring, or passing through a limiter, sinusoidal signals at the local oscillator (LO) frequency with phase differences of 0, 60, 90, and 150 degrees with respect to each other. The sinusoidal signals are usually generated by using poly-phase filters that may include resistive-capacitive (RC) sections that realize phase shift. However, poly-phase filters are bulky, narrow-band, and consume a lot of power.

Thus, there is a need for improved systems and methods for implementing a harmonic rejection transmitter.

SUMMARY

Various embodiments of systems and methods for implementing a harmonic rejection mixer are provided. One embodiment is a system for generating local oscillator (LO) signals for a harmonic rejection mixer. One such system comprises a local oscillator, a divide-by-N frequency divider, a divide-by-three frequency divider, and a harmonic rejection mixer. The local oscillator is configured to provide a reference frequency signal. The divide-by-N frequency divider is configured to divide the reference frequency signal by a value N and provide an output signal. The divide-by-three frequency divider is configured to receive the output signal of the divide-by-N frequency divider and divide the output signal into three phase-offset signals. The harmonic rejection mixer is configured to receive the three phase-offset signals and eliminate third frequency harmonics.

The drawings and detailed description that follow are not exhaustive. The disclosed embodiments are illustrated and described to enable one of ordinary skill to make and use the invention. Other embodiments, features and advantages of the invention will be or will become apparent to those skilled in the art upon examination of the following figures and detailed description. All such additional embodiments, features and advantages are within the scope of the disclosed systems and methods as defined in the accompanying claims.

BRIEF DESCRIPTION OF DRAWINGS

The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
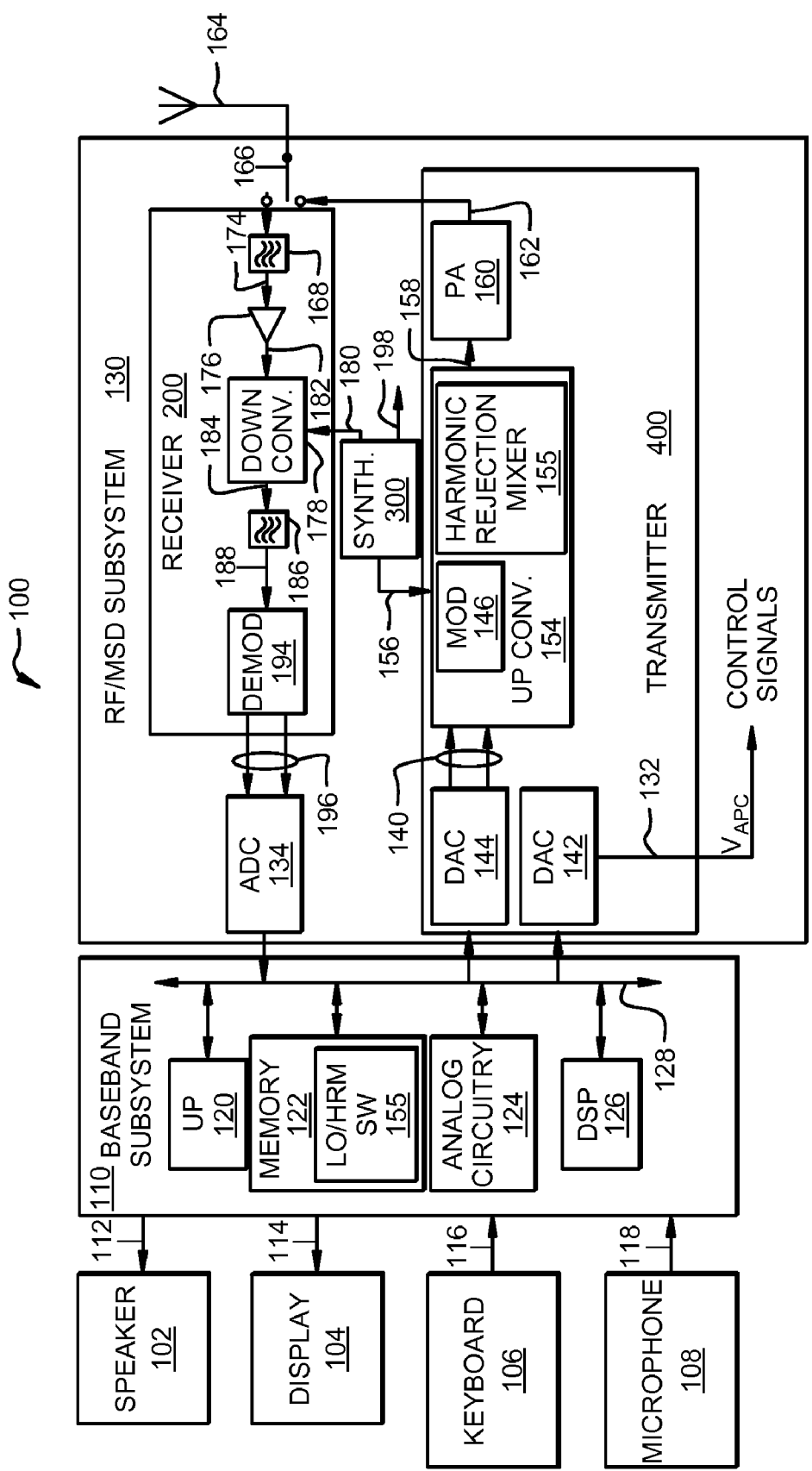
FIG. 1 is a block diagram illustrating a simplified portable transceiver including a harmonic rejection transmitter.

Various exemplary embodiments of systems and methods for generating local oscillator (LO) signals for a harmonic rejection mixer (HRM) are described with particular reference to a portable transceiver operating in the global system for mobile communications (GSM) communication system, although the LO signal generation systems and methods may be incorporated in any transmitter implementing a HRM to upconvert a radio frequency (RF) signal. Furthermore, the LO signal generation systems and methods for a HRM may be implemented in hardware, software, firmware, or any combination thereof. When implemented in hardware, the systems and methods may be implemented using specialized hardware elements and logic. When the systems and methods are implemented wholly or partially in software, the software may be used to control the various components in the transmitter. The software may be stored in a memory and executed by a suitable instruction execution system (e.g., a microprocessor). The hardware implementations may include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

For software embodiments, the software for the LO signal generation systems and methods for a HRM may comprise an ordered listing of executable instructions for implementing logical functions, and may be embodied in any computer readable medium for use by or in connection with an instruction execution system, apparatus, or device, such as a computer-based system, processor-containing system, or other system that can fetch the instructions from the instruction execution system, apparatus, or device and execute the instructions. The computer readable medium may be any means that can contain, store, communicate, propagate, or transport the program for use by or in connection with the instruction execution system, apparatus, or device. The computer readable medium may be, for example but not limited to, an electronic, magnetic, optical, electromagnetic, infrared, or semiconductor system, apparatus, device, or propagation medium. More specific examples (a non-exhaustive list) of the computer readable medium may include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer readable medium may even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100 for implementing various embodiments of LO signal generation systems and methods. The portable transceiver 100 comprises a speaker 102, display 104, keyboard 106, and microphone 108, all connected to a baseband subsystem 110. In one embodiment, the portable transceiver 100 may be, for example but not limited to, a wireless telecommunication handset such as a mobile cellular-type telephone. The speaker 102 and the display 104 receive signals from the baseband subsystem 110 via connections 112 and 114, respectively, as known to those skilled in the art. Similarly, the keyboard 106 and the microphone 108 supply signals to the baseband subsystem 110 via connections 116 and 118, respectively. The baseband subsystem 110 includes a microprocessor (μP) 120, a memory 122, analog circuitry 124, and a digital signal processor (DSP) 126 in communication via a bus 128. The bus 128, although shown as a single connection, may be implemented using a number of busses connected as necessary among the subsystems within baseband subsystem 110. The microprocessor 120 and the memory 122 provide the signal timing, processing and storage functions for the portable transceiver 100. In embodiments in which the LO signal generation systems and methods for a HRM are implemented in software, the memory 122 may comprise LO/HRM software 155 that may be executed by the microprocessor 120, the DSP 126 or by another processor.

The analog circuitry 124 provides the analog processing functions for the signals within the baseband subsystem 110. The baseband subsystem 110 communicates with the radio frequency (RF)/mixed signal device (MSD) subsystem 130 via the bus 128.

The RF/MSD subsystem 130 includes both analog and digital components. Generally, the RF/MSD subsystem 130 includes a receiver 200, a synthesizer 300 and a harmonic rejection transmitter 400. In the embodiment illustrated in FIG. 1, the RF/MSD subsystem 130 includes an analog-to-digital converter 134, and the harmonic rejection transmitter 400 includes one or more digital-to-analog converters (DACS) 142 and 144.

The ADC 134, the DAC 142 and the DAC 144 also communicate with the microprocessor 120, the memory 122, the analog circuitry 124 and the DSP 126 via the bus 128. The DAC 144 converts the digital communication information within the baseband subsystem 110 into an analog signal for transmission by the harmonic rejection transmitter 400 via the connection 140. The connection 140, while shown as two directed arrows, includes the information that is to be transmitted by RFAMSD subsystem 130 after conversion from the digital domain to the analog domain.

The DAC 144 operates on baseband in-phase (I) and quadrature-phase (Q) components. The DAC 144 communicates with an upconverter 154 that includes an I/Q modulator 146 and a harmonic rejection mixer 155. The structure and operation of the upconverter 154 and the LO signal generation systems and methods for the HRM 155 are described in more detail below. In general, however, the I/Q modulator 146 modulates the I and Q information signals received from the DAC 144 onto a frequency reference signal referred to as a "local oscillator" or "LO" signal provided by the synthesizer 300 via the connection 156.

The synthesizer 300 determines the appropriate frequency to which the upconverter 154 will translate the modulated signal. In one embodiment, the synthesizer 300 uses a single voltage controlled oscillator (VCO), operating at a center frequency of approximately 2.5 to 3.0 gigahertz (GHz) in this example, and frequency dividers to provide the desired LO signals to the harmonic rejection transmitter 400 and to the receiver 200.

The upconverter 154 supplies a phase modulated signal at an appropriate transmit frequency via a connection 158 to a power amplifier 160. The power amplifier 160 amplifies the phase-modulated signal on the connection 158 to the appropriate power level for transmission via a connection 162 to an antenna 164. Illustratively, the switch 166 controls whether the amplified signal on the connection 162 is transferred to the antenna 164 or whether a received signal from the antenna 164 is supplied to the filter 168. The operation of the switch 166 is controlled by a control signal from the baseband subsystem 110 via the connection 132.

A signal received by the antenna 164 may, at the appropriate time determined by the baseband subsystem 110, be directed via the switch 166 to a receive filter 168. The receive filter 168 filters the received signal and supplies the filtered signal on the connection 174 to a low noise amplifier (LNA) 176. Although a single LNA 176 is shown in FIG. 1, it is understood that a plurality of LNAs may be used, depending on the operational frequency or frequencies of the portable transceiver 100. The receive filter 168 may be a bandpass filter that passes all channels of the particular cellular system where the portable transceiver 100 is operating. As an example, in an embodiment in which a 900 MHz GSM system is supported, the receive filter 168 would pass all frequencies from 925.1 MHz to 959.9 MHz, covering all 175 contiguous channels of 200 kHz each. The purpose of the receive filter 168 is to reject all frequencies outside the desired region. The LNA 176 amplifies the very weak signal on the connection 174 to a level at which the downconverter 178 can translate the signal from the transmitted frequency back to a baseband frequency. Alternatively, the functionality of the LNA 176 and the downconverter 178 can be accomplished using other elements, such as, for example but not limited to, a low noise block downconverter (LNB). In this example, the receiver 200 operates as a direct conversion receiver (DCR) in which the received RF signal is downconverted directly to a baseband signal. In one embodiment, the LNA 176 is fully differential and operates without inductances and baluns and using no voltage gain such that large electric fields are eliminated at the input to the LNA 176.

The downconverter 178 receives one or more LO signals from the synthesizer 300 via the connection 180. The synthesizer 300 determines the frequency to which to downconvert the signal received from the LNA 176 via the connection 182. In the case of a DCR, the received signal is converted directly to baseband (DC), or near-baseband. The downconverter 178 sends the downconverted signal via the connection 184 to a channel filter 186, also called the "IF filter." The channel filter 186 selects the one desired channel and rejects all others. In the GSM system embodiment, only one of the 175 contiguous channels is actually to be received. After all channels are passed by the receive filter 168 and downconverted in frequency by the downconverter 178, only the one desired channel will appear precisely at the center frequency of channel filter 186. The synthesizer 300, by controlling the local oscillator frequency supplied on the connection 180 to the downconverter 178, determines the selected channel. The demodulator 194 recovers the transmitted analog information and supplies a signal representing this information via the connection 196 to the ADC 134. The ADC 134 converts these analog signals to a digital signal at baseband frequency and transfers it via the bus 128 to the DSP 126 for further processing.

Figure 2:
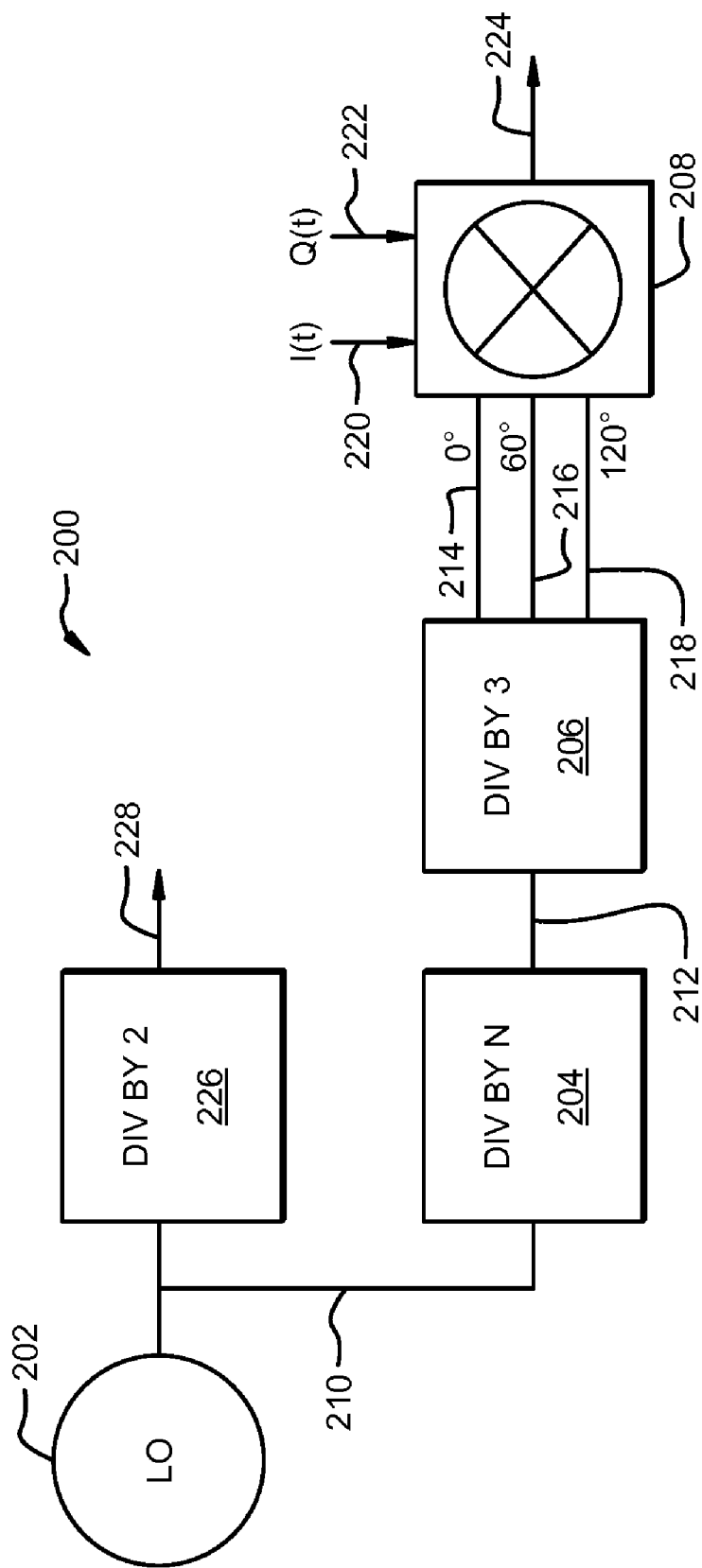
FIG. 2 is a schematic diagram illustrating an embodiment of a system and method for generating local oscillator (LO) signals for a harmonic rejection mixer in the transmitter of FIG. 1.

Having described the general components and operation of the portable transceiver 100, various embodiments of systems and methods for generating LO signals for the harmonic rejection transmitter 400 will be described with reference to FIGS. 2-9. FIG. 2 is a schematic diagram illustrating one embodiment of a system 200 for generating LO signals for a harmonic rejection mixer, such as, the HRM 155 illustrated in FIG. 1. The system 200 comprises a local oscillator 202, a divide-by-N frequency divider 204, a divide-by-3 frequency divider 206, a harmonic rejection mixer 208, and a divide-by-2 frequency divider 226. The local oscillator 202 provides a reference frequency signal to the frequency dividers 226 and 204 via a connection 210. The reference frequency signal may be provided by the synthesizer 300 via the connection 156. The frequency divider 226 divides the reference frequency signal by 2 for providing an LO signal for the highband transmit signal on the connection 228.

For a lowband transmit signal, the divide-by-N frequency divider 204 divides the reference frequency signal by an appropriate divisor, N. The numerical value of N may comprise any desirable value for purposes of upconversion and based on, for example, the particular configuration of the portable transceiver 100 and the wireless systems and standards supported by the portable transceiver. In an embodiment, the divide-by-N frequency divider 204 may be selectively controlled to support N values of 12, 13, 14, or 15. The output of the divide-by-N frequency divider 204 is provided to the divide-by-3 frequency divider 206 on connection 212. The divide-by-3 frequency divider 206 divides the output signal of the divide-by-N frequency divider 204 into three phase-offset signals. In the embodiment illustrated in FIG. 4, the three phase-offset signals, $B_{0°}(t)$, $B_{60°}(t)$, and $B_{120°}(t)$, are offset by 0 degrees, 60 degrees, and 120 degrees at the fundamental frequency of operation (i.e., the frequency at the output of the divide-by-3 frequency divider 206). The divide-by-3 frequency divider 206 may be single-ended or differential and, in an embodiment, comprises a CMOS-based frequency divider with an approximately 50% duty cycle. The three phase-offset signals are provided to the harmonic rejection mixer 208 via the connections 214, 216, and 218. The harmonic rejection mixer 208 also receives via the connections 220 and 224 the baseband signals I and Q. In general and as described in more detail below, the harmonic rejection mixer 208 is configured with appropriate modulator weights based on the three phase-offset signals to achieve $3^{rd}$ harmonic cancellation.

As described above, one of the problems with a conventional mixer used in an upconverter is that it generates undesirable noise. The upconversion process involves superimposing baseband information on a high frequency carrier signal, such that the following equation may be realized:

$$V_0(t)=[I(t)\cos \omega_{LO}(t)]+[Q(t)\sin \omega_{LO}(t)] \qquad \text{Equation 1}$$

To suppress the noise, local oscillator (LO) signals may be hard-switched or a square wave signal may be applied instead of a sinusoidal signal. As a result, $V_0(t)$ may contain the modulated signal around $\omega_{LO}$ and unwanted harmonics at odd harmonics, such as, $3\omega_{LO}$, $5\omega_{LO}$, and so on. These harmonics may cause distortions in the transmitted output when they pass through output buffers or the power amplifier 160 that may exhibit a non-linear response or have non-linear characteristics. Therefore, it is desirable to remove these harmonics.

When a conventional mixer is used, the limited rejection of harmonics typically requires a relatively high-Q filter at the mixer output that passes $\omega_{LO}$ but rejects odd harmonics (e.g., $3\omega_{LO}$, $5\omega_{LO}$). However, a high-Q filter has the undesirable characteristics mentioned above. The filter requirements may be simplified by using a harmonic rejection mixer that provides attenuation for the $3^{rd}$ harmonic. A typical $3^{rd}$ harmonic rejection mixer obtains four signals ($A_{0°}(t)$, $A_{60°}(t)$, $A_{90°}(t)$, $A_{150°}(t)$) by squaring, or passing through a limiter, sinusoidal signals at the local oscillator (LO) frequency with phase differences of 0, 60, 90, and 150 degrees with respect to each other. The sinusoidal signals are usually generated by using poly-phase filters that may include RC sections that realize phase shift. However, poly-phase filters are bulky, narrow-band, and consume a lot of power. The harmonic rejection mixer 208 eliminates the need for poly-phase filters, and provides a compact, low-power, wide-band implementation for $3^{rd}$ harmonic cancellation.

Figure 3:
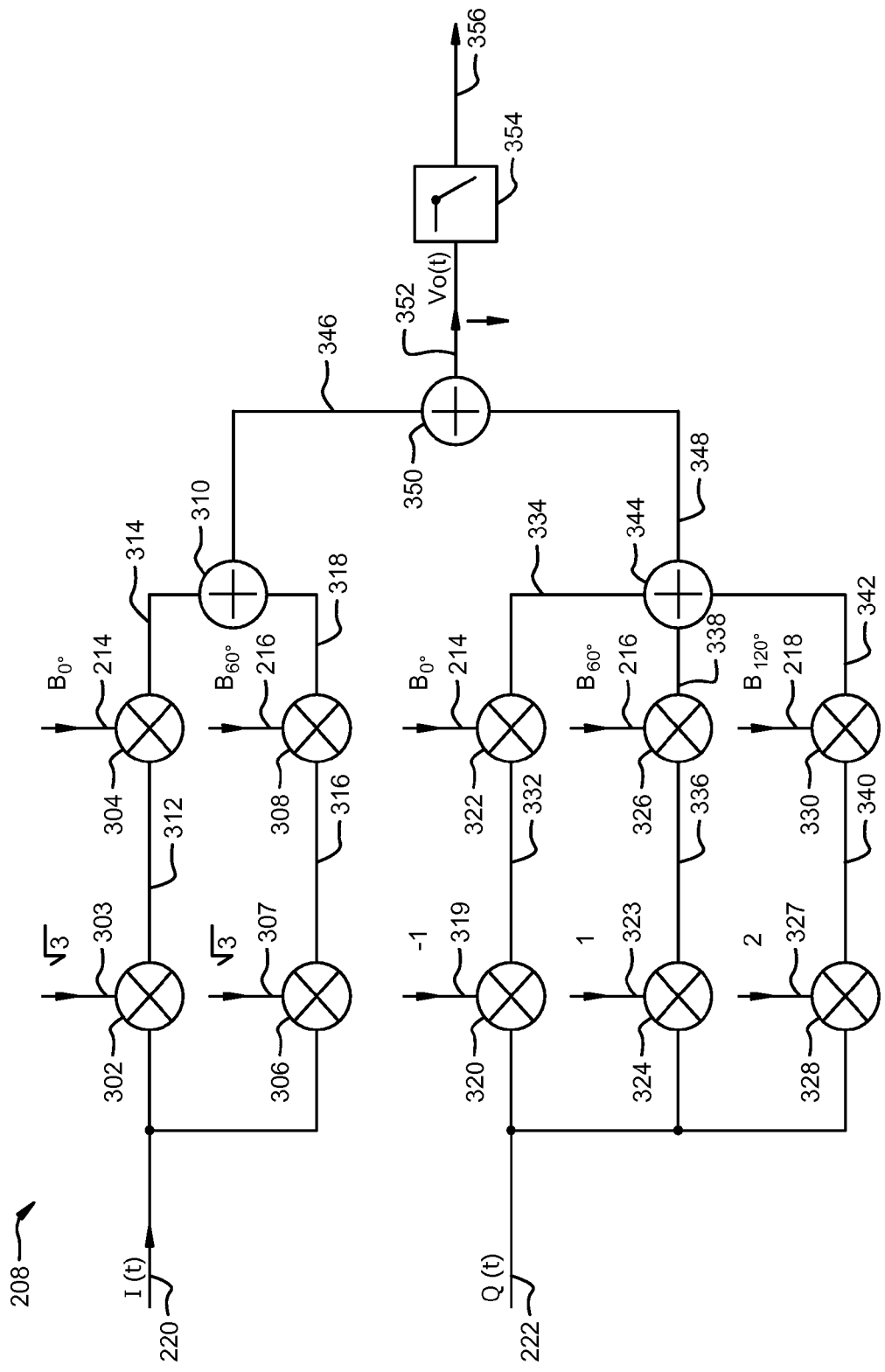
FIG. 3 is a schematic diagram illustrating an embodiment of the harmonic rejection mixer of FIG. 2.
Figure 4:
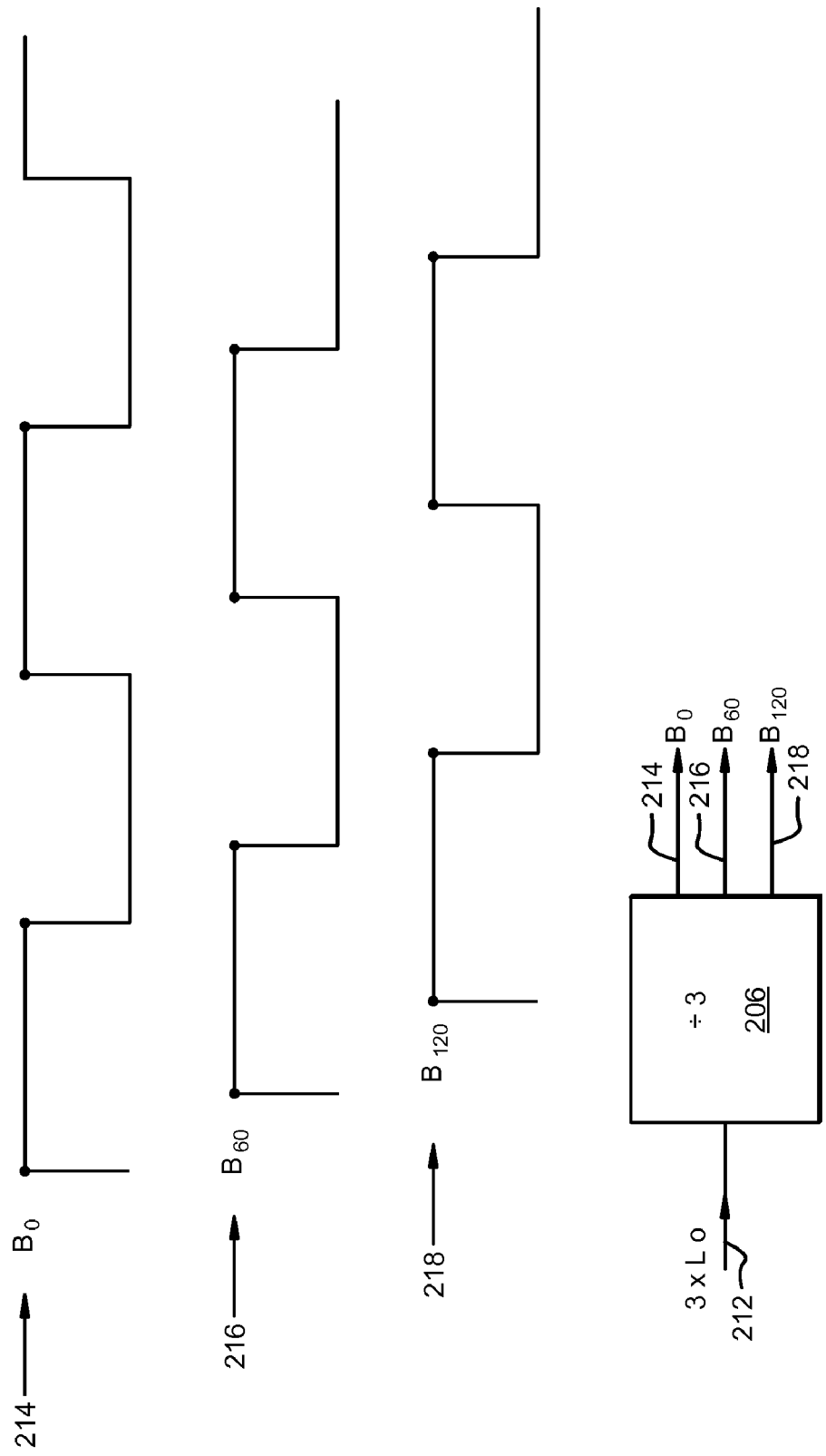
FIG. 4 is a timing diagram illustrating the output signals of the divide-by-three frequency divider.

FIG. 3 is a schematic diagram illustrating an implementation of the harmonic rejection mixer 208. The harmonic rejection mixer 208 receives the baseband signals I(t) and Q(t) on the connections 220 and 222, respectively. The signal I(t) is provided to two parallel sections of mixers. The first section comprises the mixer elements 302 and 304, and the second section comprises the mixer elements 306 and 308. The mixer element 302 receives the signal I(t) at one input and a numerical approximation of the value $\sqrt{3}$ at a second input 303. The mixer element 302 mixes these input signals and provides the output signal to the mixer element 304 via the connection 312. The mixer element 304 mixes the output of the mixer element 302 with the phase-offset signal $B_{0°}$ received via the connection 214 from the divide-by-three frequency divider 206 (FIG. 2). The output of the mixer element 304 is provided to the summation element 310 via the connection 314.

Referring to the second section of mixers, the mixer element 306 receives the signal I(t) at one input and an approximation of the value $\sqrt{3}$ at a second input. The mixer element 306 mixes these input signals and provides an output signal to the mixer element 308 via the connection 316. The mixer element 308 mixes the output of the mixer element 306 with the phase-offset signal $B_{60°}(t)$ received via the connection 216 from the divide-by-three frequency divider 206 (FIG. 2). The output of the mixer element 308 is provided to the summation element 310 via the connection 318. The summation element 310 adds the two signals together and provides a sum of the two input signals to the summation element 350 via the connection 346.

The signal Q(t) is provided to three parallel sections of mixers. The first section comprises the mixer elements 320 and 322, the second section comprises the mixer elements 324 and 326, and the third section comprises the mixer elements 328 and 330. The mixer element 320 receives the signal Q(t) at one input and an approximation of the value −1 at a second input. The mixer element 320 mixes these input signals and provides the output signal to the mixer element 322 via the connection 332. The mixer element 322 mixes the output of the mixer element 320 with the phase-offset signal $B_{0°}(t)$ received via the connection 214 from the divide-by-three frequency divider 206 (FIG. 2). The output of the mixer element 322 is provided to the summation element 344 via the connection 334.

The mixer element 324 receives the signal Q(t) at one input and an approximation of the value 1 at a second input. The mixer element 324 mixes these input signals and provides the output signal to the mixer element 326 via the connection 336. The mixer element 326 mixes the output of the mixer element 324 with the phase-offset signal $B_{60°}(t)$ received via the connection 216 from the divide-by-three frequency divider 206 (FIG. 2). The output of the mixer element 326 is provided to the summation element 344 via the connection 338.

The mixer element 328 receives the signal Q(t) at one input and an approximation of the value 2 at a second input. The mixer element 328 mixes these input signals and provides the output signal to the mixer element 330 via the connection 340. The mixer element 330 mixes the output of the mixer element 328 with the phase-offset signal $B_{120°}(t)$ received via the connection 218 from the divide-by-three frequency divider 206 (FIG. 2). The output of the mixer element 330 is provided to the summation element 344 via the connection 342.

The summation element 344 adds the three input signals together and provides the result to the summation element 350. The summation element 350 sums the outputs of the respective I(t) and Q(t) sections (on the connections 346 and 348, respectively) and provides the output signal, $V_0(t)$, on the connection 352. For the purpose of illustrating the third harmonic cancellation achieved with this structure, it should be appreciated that the structure and operation of the harmonic rejection mixer 208 may be represented with the following equation for the output signal, $V_0(t)$:

$$V_0(t)=[(\sqrt{3}B_{0°}(t)+\sqrt{3}B_{60°}(t))I(t)]+[(-B_{0°}(t)+B_{60°}(t)+2*B_{120°}(t))Q(t)] \quad \text{Equation 2}$$

Referring to Equation 2, the fundamental frequency components of $(B_{0°}(t)+B_{60°}(t))$ and $(-B_{0°}(t)+B_{60°}(t)+2*B_{120°}(t))$ are substantially orthogonal to each other. In this regard, the third harmonics of the square waves may be considered as follows. The third harmonic of $B_{60°}$ cancels the third harmonic of $B_{0°}$, and the third harmonic of $(-B_{0°}(t)+B_{60°}(t))$ cancels the 3$^{rd}$ harmonic of $2*B_{120°}(t)$. Furthermore, the $\sqrt{3}$ factor that is multiplied with $B_{0°}(t)$ and $B_{60°}(t)$ in the first part of Equation 2 equalizes the relative magnitudes of the fundamental components of $(B_{0°}(t)+B_{60°}(t))$ and $(-B_{0°}(t)+B_{60°}(t)+2*B_{120°}(t))$. Referring again to Equation 1, the fundamental component of $(\sqrt{3}*B_{0°}(t)+\sqrt{3}*B_{60°}(t))$ is $\cos \omega_{LO}(t)$, and the fundamental component of $(-1*B_{0°}(t)+1*B_{60°}(t)+2*B_{120°}(t))$ is $\sin \omega_{LO}(t)$. In this manner, the third harmonics have been eliminated. As further illustrated in FIG. 3, the harmonic rejection mixer 208 may further comprise a low pass filer (LPF) 354 configured with properties to cancel, for example, the fifth and seventh harmonics. Because LPF 354 is attenuating only the fifth and higher harmonics, the Q requirements of the filter may be relaxed. The LPF 354 receives the signal $V_0(t)$ via the connection 352 and the output signal (with fifth and seventh harmonic cancellation) is provided to the connection 356 for further processing in the portable transceiver 100. In an embodiment, the low pass filter (LPF) 354 comprises a singled-ended implementation with a basic RC filter, although any desirable configuration may be implemented to achieve the desired harmonic cancellation (e.g., fifth, seventh).

Figures 5, 6:
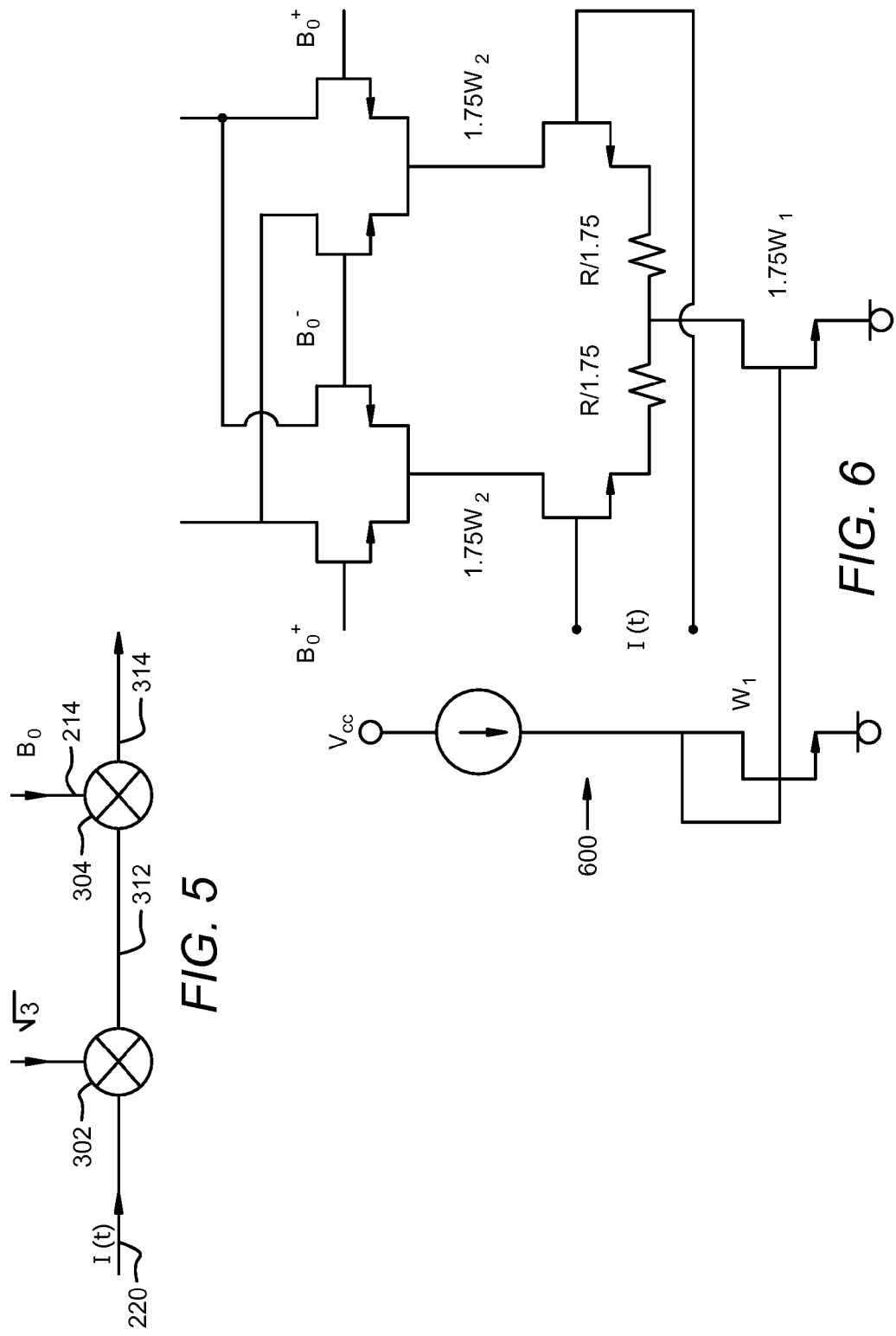
FIG. 5 is a schematic diagram of the upper mixer section of the harmonic rejection mixer of FIG. 3.
FIG. 6 is a circuit diagram of an embodiment of the upper mixer section illustrated in FIG. 5.

The harmonic rejection mixer 208 may be implemented in various circuit configurations. For purposes of generally illustrating the structure of the harmonic rejection mixer 208, the implementation of one section of the block diagram of FIG. 3 is discussed here. FIG. 5 illustrates the upper mixer section of mixer elements 302 and 304 that receive the baseband signal I(t), and FIG. 6 illustrates an embodiment of a circuit 600 for implementing the mixer elements 302 and 304. As illustrated in the embodiment of FIG. 6, the mixer elements 302 and 304 may be implemented using, for example, a single Gilbert mixer configuration. The circuit 600 generally comprises a conventional double-balanced Gilbert mixer configuration, where the baseband signal, I(t) in this case, is input on the lower differential pair, while the corresponding LO signal is input on the upper pair of differential circuits. The lower-differential pair of transistors is degenerated by resistors that set the voltage-to-current conversion ratio. The multiplication factor $\sqrt{3}$ is implemented by choosing the appropriate resistor value, corresponding width or ratio of the current source transistors, and width of the input differential pair transistors. The upper pair of field effect transistors (FETs), which are also sized accordingly, multiply the current signal from the lower degenerated common source or Gm stage (trans-conductance) with the differential LO voltage signal $B_0$. The current from the Gm stage is commutated to the output by the switching action of the LO signals. The summation of the various sections of FIG. 3 (other sections are similar in implementation and are not shown in the schematic), represented by 310, 344, 350 of FIG. 3, is implemented by connecting the various Gilbert mixer output currents together. The combined current flows to a pair of differential load resistors that convert the current to a voltage. A low pass filter (LPF) may be implemented by connecting an appropriate capacitance in parallel with these resistances.

Figure 7:
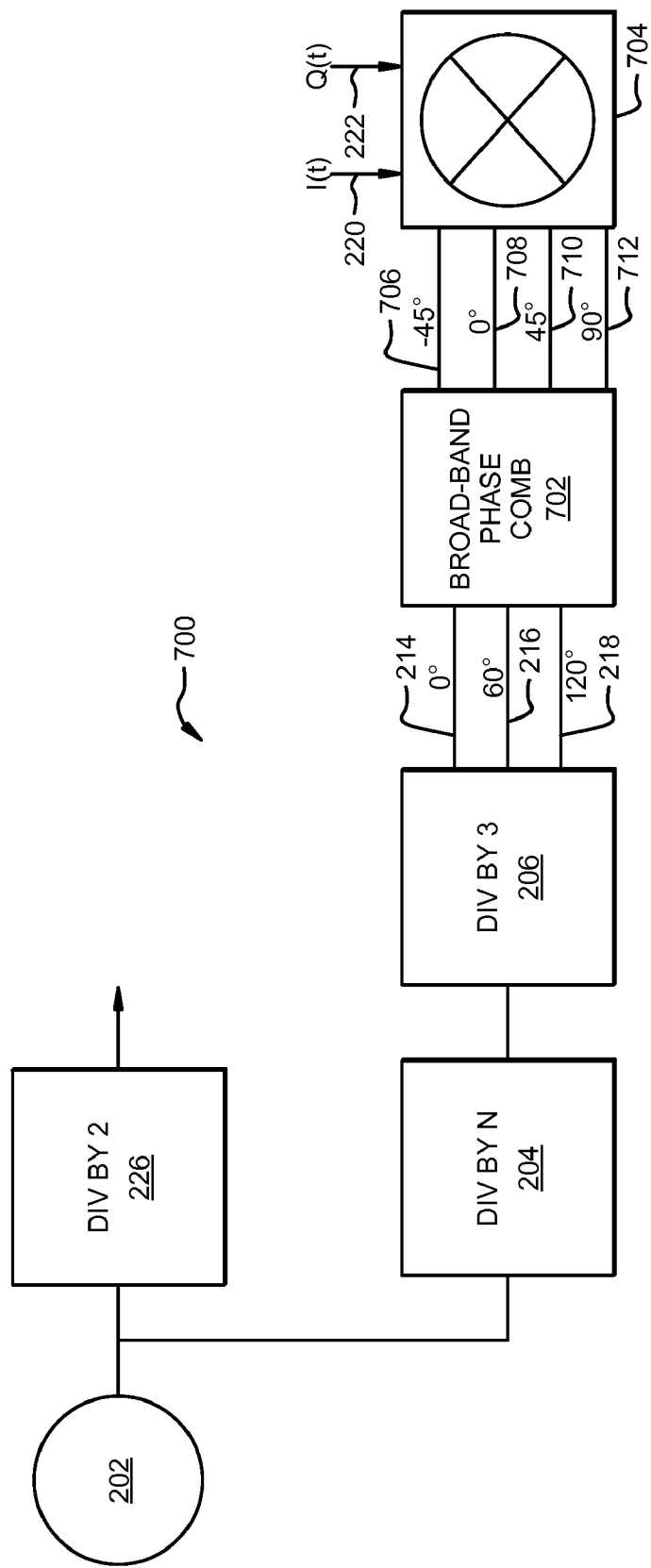
FIG. 7 is a schematic diagram illustrating another embodiment of a system and method for generating local oscillator (LO) signals for a harmonic rejection mixer in the transmitter of FIG. 1.

FIG. 7 illustrates another embodiment of a system 700 for generating LO signals for a harmonic rejection transmitter 400. In this embodiment, the harmonic rejection mixer 704 is configured to cancel both third and fifth harmonics, thereby further relaxing the Q requirements of the LPF 354. The general structure and operation of the system 700 will be described with reference to the following equation for the output signal, $V_0(t)$:

$$V_0(t)=[(A_{-45°}(t)+\sqrt{2}*A_{0°}(t)+*A_{45°}(t))I(t)]+[(A_{45°}(t)+\sqrt{2}*A_{90°}(t)+*A_{135°}(t))Q(t)] \quad \text{Equation 3}$$

The signal $A_{135°}(t)$ is the complementary signal of $A_{45°}(t)$, and is readily available in a differential implementation. The signals $A_{-45°}(t)$, $A_{0°}(t)$, $A_{45°}(t)$ and $A_{90°}(t)$ represent square wave signals having fundamental frequency components at −45, 0, 45 and 90 degrees phase offset from each other.

Equation 3 illustrates the generation of the LO signals for the HRM architecture. As described below in more detail, the frequency plan uses a divide-by-three element in the LO chain. The outputs of divide-by-three element are used to realize the phases, 0 degrees, 45 degrees, 90 degrees, and 135 degrees, and their complementary signals of 180 degrees, 225 degrees, 270 degrees, and 315 degrees, respectively. These phases may be readily available with a conventional divide-by-four circuit. It should be appreciated, however, that the frequency plan for the system 700 does not permit a divide-by-four circuit. Therefore, as illustrated in FIG. 7, a specially configured conversion block (e.g., a broadband phase recombiner 702) is used between the divide-by-three element 206 and the harmonic rejection mixer 704.

The system 700 is similar to the system 200 described above. For example, the system 700 may comprise the divide-by-two frequency divider 226, the divide-by-N frequency divider 204, and the divide-by-three frequency divider 206. In the embodiment illustrated in FIG. 6, the system 700 further comprises a broadband phase recombiner 702 and the harmonic rejection mixer 208 is replaced with the harmonic rejection mixer 704. The broadband phase recombiner 702 receives the three phase-offset signals $B_{0°}$, $B_{60°}$, and $B_{120°}$ provided by the divide-by-three frequency divider 206 via the connections 214, 216, and 218, respectively. The broadband phase recombiner 702 provides four output signals, $C_{-45°}(t)$, $C_{0°}(t)$, $C_{45°}(t)$, and $C_{90°}(t)$, on the connections 706, 708, 710, and 712, respectively. In a differential implementation, all complementary phases of the above signals are also available. In one embodiment, the broadband phase recombiner 702 is configured to provide the output signals, according to the following equations:

$$C_{0°}(t)=\sqrt{3}B_{0°}(t)+\sqrt{3}B_{60°}(t) \quad \text{Equation 4}$$

$$C_{90°}(t)=-B_{0°}(t)+B_{60°}(t)+2B_{120°}(t) \quad \text{Equation 5}$$

$$C_{45°}(t)=C_{0°}(t)+C_{90°}(t)=(\sqrt{3}-1)B_{0°}(t)+(\sqrt{3}+1)B_{60°}(t)+2B_{120°}(t) \quad \text{Equation 6}$$

$$C_{-45°}(t)=C_{0°}(t)-C_{90°}(t)=(\sqrt{3}+1)B_{0°}(t)+(\sqrt{3}-1)B_{60°}(t)-2B_{120°}(t) \quad \text{Equation 7}$$

The signals $C_{-45°}(t)$, $C_{0°}(t)$, $C_{45°}(t)$, and $C_{90°}(t)$ are obtained from $B_{0°}(t)$, $B_{60°}(t)$, and $B_{120°}(t)$. The fundamental components have phases of 0, 90, 45, and −45 degrees, respectively, at the fundamental frequency of operation. The third harmonics may be relatively low due to the third harmonic rejection as discussed above. These signals are then low-pass filtered to reduce their higher harmonics (e.g., $5^{th}$, $7^{th}$). They are then passed through a limiter to obtain the LO signals necessary for the harmonic rejection mixer 704. The desired phase differences between the signals $C_{45°}(t)$, $C_{0°}(t)$, $C_{45°}(t)$, and $C_{90°}(t)$ are obtained because of the sinusoidal signals generated by the summation block and low pass filter(s) described above, which have higher harmonics (e.g., $3^{rd}$, $5^{th}$, etc.), before passing the signals through the limiters. It should be appreciated that the presence of $3^{rd}$ or $5^{th}$ or higher harmonics in the signal at the limiter input changes the zero crossings of the output waveforms. This may significantly change the timing relationship between the signals at the output of the limiter and which may degrade the sideband rejection and harmonic rejection of the system. One of ordinary skill in the art will appreciate that the signals $C_{-45°}(t)$, $C_{0°}(t)$, $C_{45°}(t)$, and $C_{90°}(t)$ may address these and other operational issues.

Because the signals go through a limiter, their relative magnitudes may be less important. Thus, it should be appreciated that the output signals $C_{-45°}(t)$, $C_{0°}(t)$, $C_{45°}(t)$, and $C_{90°}(t)$ may be simplified as follows:

$$C_{0°}(t)=B_{0°}(t)+B_{60°}(t) \quad \text{Equation 8}$$

$$C_{90°}(t)=-B_{0°}(t)+B_{60°}(t)+2B_{120°}(t) \quad \text{Equation 9}$$

$$C_{45°}(t)=(\sqrt{3}-1)B_{0°}(t)+(\sqrt{3}+1)B_{60°}(t)+2B_{120°}(t) \quad \text{Equation 10}$$

$$C_{-45°}(t)=(\sqrt{3}+1)B_{0°}(t)+(\sqrt{3}-1)B_{60°}(t)-2B_{120°}(t) \quad \text{Equation 11}$$

Figure 8:
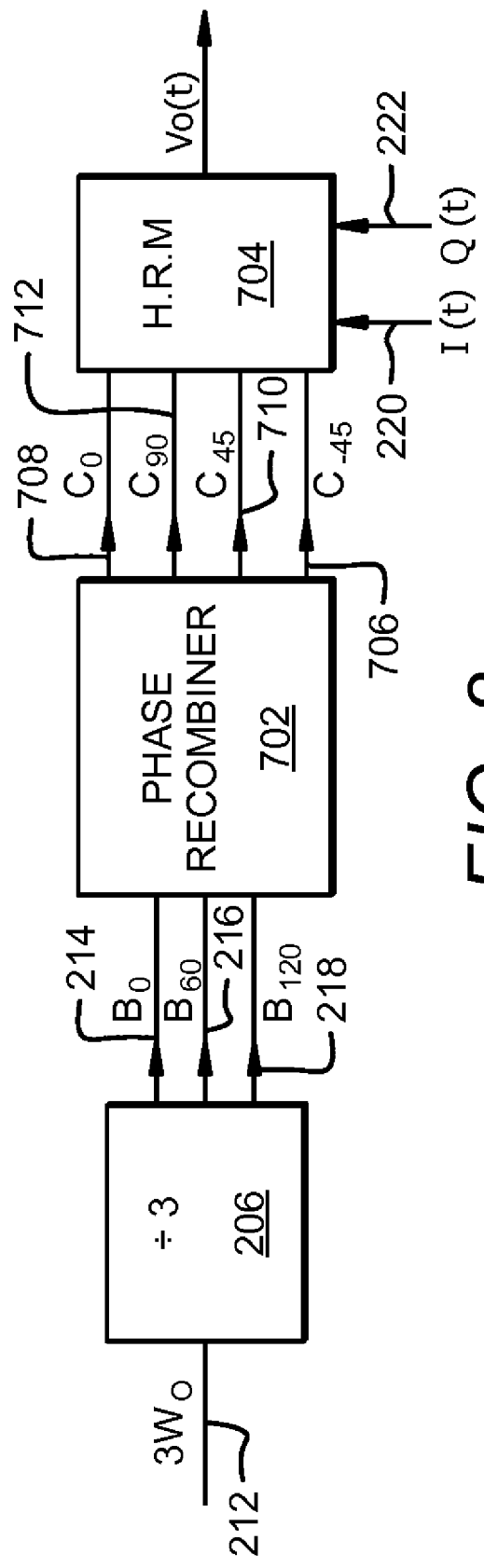
FIG. 8 is a simplified block diagram illustrating the local oscillator (LO) signal generation for the system of FIG. 7.

FIG. 8 is a simplified block diagram illustrating the LO signal generation for the system 700. The divide-by-three frequency divider 206 receives a signal with a frequency $3\omega_O$ and provides the output signals $B_{0°}(t)$, $B_{60°}(t)$, and $B_{120°}(t)$ at $\omega_O$. The phase recombiner 702 provides the square wave output signals $C_{-45°}(t)$, $C_{0°}(t)$, $C_{45°}(t)$, and $C_{90°}(t)$ to the harmonic rejection mixer 704.

Figure 9:
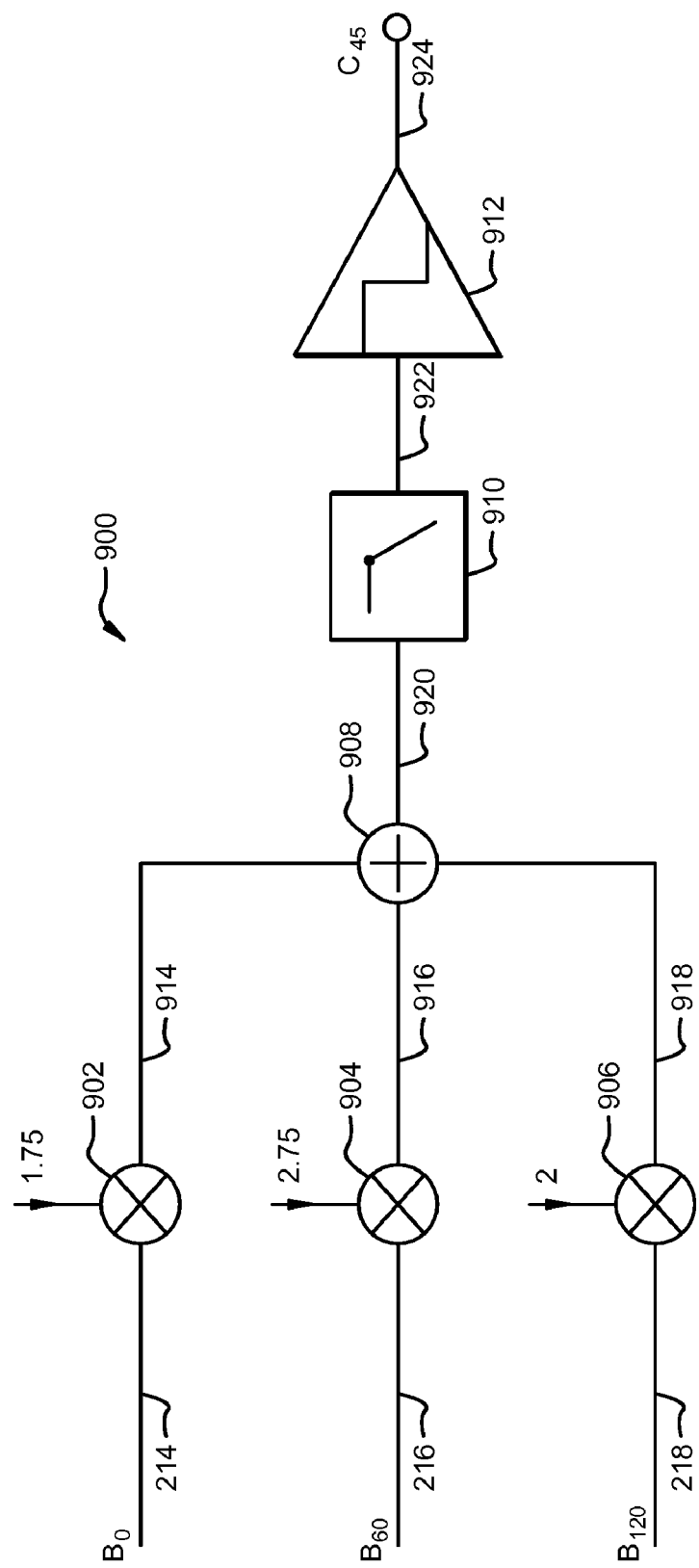
FIG. 9 is a schematic diagram illustrating one embodiment of a circuit for generating the signal $C_{45°}$ in the phase recombiner of FIG. 8.

FIG. 9 illustrates one embodiment of a system 900 for implementing the logic of the phase recombiner 702 with respect to generating the signal $C_{45°}(t)$. The other signals may be provided in a similar manner. As illustrated in FIG. 9, the system 900 comprises three parallel mixer elements 902, 904, and 906, a summation element 908, a low pass filter 910, and a limiting amplifier 912. The mixer elements may comprise differential pairs degenerated by resistances that set the gain or multiplication ratio of the transistor elements. The bias current source may be scaled by the gain or multiplication ratio. For example, multiplication by N may be achieved by choosing a resistance value R/N, where the current source ratio and differential pair size is N times the nominal value. The LO signal may be input as a voltage signal on the differential pair. The summation of current may be achieved by connecting the outputs of the various differential pairs together.

In operation, the mixer element 902 receives the output signal $B_{0°}(t)$ at one input and a degeneration resistance value that is scaled by 1.75 (as an approximation of the value $1/\sqrt{3}$). The mixer element 902 mixes these input signals and provides the output signal to the summation element 908 via the connection 914. The mixer element 904 receives the output signal $B_{60°}(t)$ at it's input and a degeneration resistance value that is scaled by 1/2.75 (as an approximation $1/(\sqrt{3}+1)$). The mixer element 904 mixes these input signals and provides the output signal to the summation element 908 via the connection 916. The mixer element 906 receives the output signal $B_{120°}(t)$ at its input. The gain is scaled by a factor of 2. The mixer element 906 mixes these input signals and provides the output signal to the summation element 908 via the connection 918. The summation element 920 combines the input signals and provides an output signal to the LPF 910. It should be appreciated that the summations may be implemented by connecting the current outputs of the various differential pairs together and then passing the resulting output current through a resistor for current-to-voltage conversion. The LPF 910 may comprise a capacitor in shunt with the load resistance. It should be further appreciated that additional filtering may be provided by adding additional RC sections or by use of other passive or active filter configurations.

The limiting amplifier 912 in this embodiment may comprise, for example, a current mode logic differential pair that is driven by voltage inputs that are large enough to completely switch the bias current of the amplifier from one side to another, resulting in a voltage output that swings from Vdd to (Vdd−Io$R_L$), where Vdd is the supply voltage of the differential pair, Io is the tail current, and $R_L$ is the load resistances.

Figure 10:
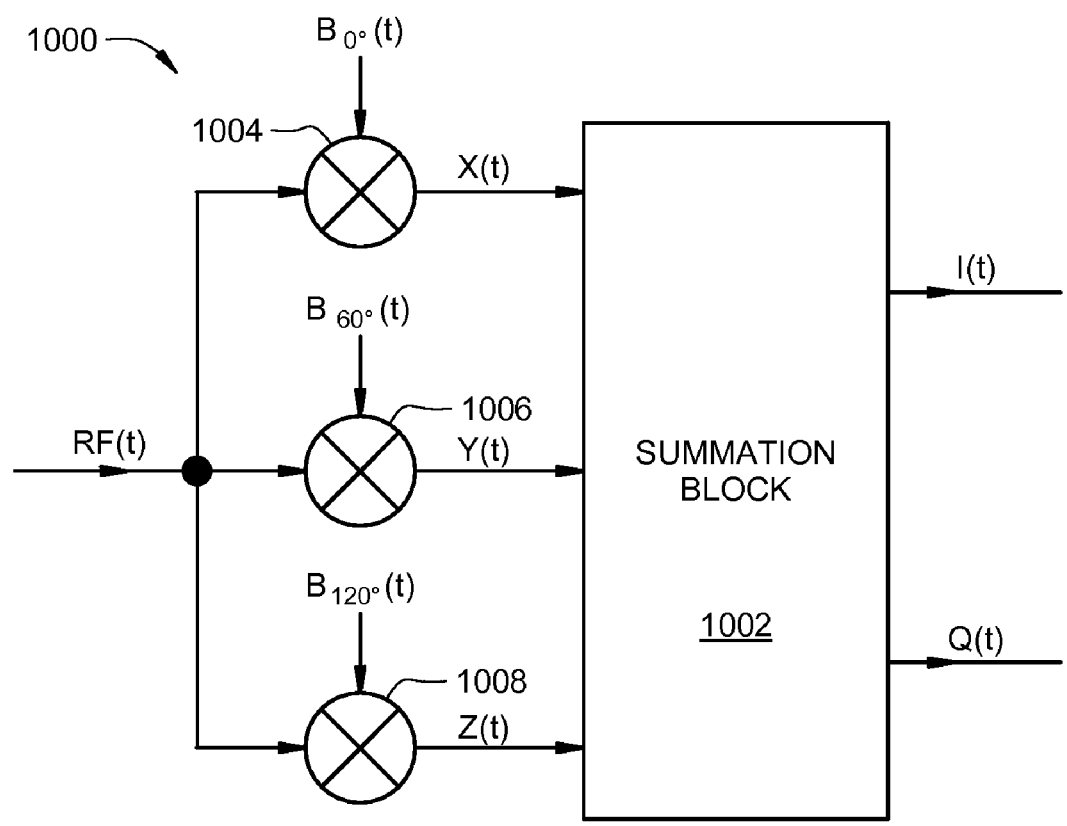
FIG. 10 is a block diagram illustrating an embodiment of a system for implementing a harmonic rejection architecture in a receiver mixer.

One of ordinary skill in the art will appreciate that the systems and methods described above with respect to an upconversion process in the transmitter 400 (FIG. 1) may also be implemented in a downconversion process in the receiver 200. FIG. 10 illustrates a block diagram of a system 1000 for implementing the third harmonic rejection architecture described above in a receiver mixer. The signals I(t) and Q(t) may be represented by the following equation:

$$I(t)=(\sqrt{3}B_{0°}(t)+\sqrt{3}B_{60°}(t))RF(t)$$

$$Q(t)=(-B_{0°}(t)+B_{60°}(t)+2B_{120°}(t))RF(t) \quad \text{Equation 12}$$

In general, the system 1000 employs a third harmonic conversion scheme similar to that described above. The system 1000 comprises mixer elements 1004, 1006, and 1008 and a baseband summation block 1002. The system 1000 downconverts a signal RF(t) at the RF frequency with desirable gain but with zero gain for a signal that is located around the third harmonic of the LO frequency.

As illustrated in FIG. 10, the input signal RF(t) is provided to the mixer elements 1004, 1006, and 1008, and then divided into three parts, either in voltage mode or in current mode, depending on the implementation of the specific mixer design. It should be appreciated that the implementation may be, for example, single-ended or differential. The three RF signals are multiplied by the LO signals, $B_{0°}(t)$, $B_{60°}(t)$, and $B_{120°}(t)$. The output signals of the mixer elements 1004, 1006 and 1008 (x(t), y(t), and z(t), respectively) are input to a phase summation block (e.g., baseband summation block 1002). The phase summation block may implement the summation either in the analog domain or in the digital domain. The summation of the signals x(t), y(t) and z(t) with the desired weighting factors may be easily implemented in the analog domain using techniques, such as those described earlier, and in an embodiment as represented by Equation 13 below:

$$I(t)=\sqrt{3}x(t)+\sqrt{3}y(t)$$

$$Q(t)=-x(t)+y(t)+2z(t) \quad \text{Equation 13}$$

The summation may also be performed in the digital domain after digitizing the signal using one or more analog-to-digital converters (ADC), following any filters that may be used for rejecting filters or for anti-aliasing. While the summation may be implemented in the digital or analog domain, it should be appreciated that the summation in the digital domain may provide several advantages, such as, for example, accurate weighting factors and various algorithms (e.g., least mean square (LMS) algorithms) for improving cancellation of $3^{rd}$ harmonics.

While various embodiments of the invention have been described, it will be apparent to those of ordinary skill in the art that many more embodiments and implementations are possible that are within the scope of this invention.

What is claimed is:

1. A system for generating local oscillator (LO) signals for a harmonic rejection mixer, the system comprising:
  a local oscillator configured to provide a reference frequency signal;
  a divide-by-N frequency divider configured to divide the reference frequency signal by a value N and provide an output signal;
  a divide-by-three frequency divider configured to receive the output signal of the divide-by-N frequency divider and divide the output signal into three phase-offset signals, the three phase-offset signals include a first signal $B_{0°}$ offset by 0 degrees, a second signal $B_{60°}$ offset by 60 degrees, and a third signal $B_{120°}$ offset by 120 degrees; and
  a harmonic rejection mixer configured to receive the three phase-offset signals and eliminate third frequency harmonics, when implemented in a transmitter having at least two input signals I(t) and Q(t) and an output signal $V_0(t)$, the harmonic rejection mixer generating the output signal $V_0(t)$ according to the following equation:

$$V_0(t)=[(\sqrt{3}B_{0°}(t)+\sqrt{3}B_{60°}(t))\,I(t)]+[(-B_{0°}(t)+B_{60°}(t)+2B_{120°}(t))Q(t)].$$

2. The system of claim 1 further comprising a low pass filter configured to eliminate fifth frequency harmonics.

3. The system of claim 1 wherein the divide-by-three frequency divider includes a CMOS integrated circuit.

4. The system of claim 1 implemented in at least one of a transmitter and a receiver.

5. The system of claim 1 wherein the divide-by-three frequency divider includes one of a differential divider circuit and a single-ended divider circuit.

6. The system of claim 1 when implemented in a receiver having an input signal, RF(t), and at least two output signals, I(t) and Q(t), the harmonic rejection mixer generating output signals I(t) and Q(t) according to the following equations:

$$I(t)=(\sqrt{3}B_{0°}(t)+\sqrt{3}B_{60°}(t))RF(t)$$

$$Q(t)=(-B_{0°}(t)+B_{60°}(t)+2B_{120°}(t))RF(t).$$

7. The system according to claim 1 wherein the harmonic rejection mixer includes a plurality of mixer elements, each mixer element configured with at least one modulator weight such that a first mixer element receives the signals I(t) and $B_{0°}$ and is configured to mix the signals I(t) and $B_{0°}$ with a first modulator weight having the numerical approximation of the value $\sqrt{3}$, a second mixer element receives the signals I(t) and $B_{60°}$ and is configured to mix the signals I(t) and $B_{60°}$ with a second modulator weight having the numerical approximation of the value $\sqrt{3}$, a third mixer element receives the signals Q(t) and $B_{0°}$ and is configured to mix the signals Q(t) and $B_{0°}$ with a third modulator weight having the numerical approximation of the value −1, a fourth mixer element receives the signals Q(t) and $B_{60°}$ and is configured to mix the signals Q(t) and $B_{60°}$ with a fourth modulator weight having the numerical approximation of the value +1, and a fifth mixer element receives the signals Q(t) and $B_{120°}$ and is configured to mix the signals Q(t) and $B_{120°}$ with a fifth modulator weight having the numerical approximation of the value +2, the harmonic rejection mixer further including a summation element, the summation element summing outputs of the plurality of mixer elements.

8. The system according to claim 1 wherein each mixer element includes a double-balanced Gilbert mixer, the at least one modulator weight of each mixer element based on at least one of a resistor value, widths of current sourcing transistors, and widths of input differential pair transistors of the double-balanced Gilbert mixer.

9. A portable transceiver comprising:
  a local oscillator configured to provide a reference frequency signal; and
  a harmonic rejection transmitter or receiver including:
    a divide-by-N frequency divider configured to divide the reference frequency signal by a value N and provide an output signal;
    a divide-by-three frequency divider configured to receive the output signal of the divide-by-N frequency divider and divide the output signal into three phase-offset signals, the three phase-offset signals include a first signal $B_{0°}$ offset by 0 degrees, a second signal $B_{60°}$ offset by 60 degrees, and a third signal $B_{120°}$ offset by 120 degrees at a fundamental frequency of operation; and
    a harmonic rejection mixer configured to receive the three phase-offset signals and eliminate third frequency harmonics, when implemented in a transmitter having at least two input signals I(t) and Q(t) and an output signal $V_0(t)$, the harmonic rejection mixer generating the output signal $V_0(t)$ according to the following equation:

$$V_0(t)=[(\sqrt{3}B_{0°}(t)+\sqrt{3}B_{60°}(t))\,I(t)]+[(-B_{0°}(t)+B_{60°}(t)+2B_{120°}(t))Q(t)].$$

10. The portable transceiver of claim 9 further comprising a low pass filter configured to eliminate fifth frequency harmonics.

11. The portable transceiver according to claim 9 wherein the harmonic rejection mixer includes a plurality of mixer elements, each mixer element configured with at least one modulator weight such that a first mixer element receives the signals I(t) and $B_{0°}$ and is configured to mix the signals I(t) and $B_{0°}$ with a first modulator weight having the numerical approximation of the value $\sqrt{3}$, a second mixer element receives the signals I(t) and $B_{60°}$ and is configured to mix the signals I(t) and $B_{60°}$ with a second modulator weight having the numerical approximation of the value $\sqrt{3}$, a third mixer element receives the signals Q(t) and $B_{0°}$ and is configured to mix the signals Q(t) and $B_{0°}$ with a third modulator weight having the numerical approximation of the value −1, a fourth mixer element receives the signals Q(t) and $B_{60°}$ and is configured to mix the signals Q(t) and $B_{60°}$ with a fourth modulator weight having the numerical approximation of the value +1, and a fifth mixer element receives the signals Q(t) and $B_{120°}$ and is configured to mix the signals Q(t) and $B_{120°}$ with a fifth modulator weight having the numerical approximation of the value +2, the harmonic rejection mixer further including a summation element, the summation element summing outputs of the plurality of mixer elements.

12. The portable transceiver according to claim 9 wherein each mixer element includes a double-balanced Gilbert mixer, the at least one modulator weight of each mixer element based on at least one of a resistor value, widths of current sourcing transistors, and widths of input differential pair transistors of the double-balanced Gilbert mixer.

13. A system for generating local oscillator (LO) signals for a harmonic rejection mixer, the system comprising:
 a local oscillator configured to provide a reference frequency signal;
 a divide-by-two frequency divider configured to divide the reference frequency signal for a highband transmit signal;
 a divide-by-N frequency divider configured to divide the reference frequency signal by a value N for a lowband transmit signal;
 a divide-by-three frequency divider configured to receive an output signal of the divide-by-N frequency divider and divide the output signal into three phase-offset signals;
 a phase recombiner configured to receive the three phase-offset signals and provide four phase-offset signals; and
 a harmonic rejection mixer configured to receive the four phase-offset signals and eliminate third and fifth frequency harmonics, the harmonic rejection mixer including a plurality of mixer elements, each mixer element configured with at least one modulator weight and including a double-balanced Gilbert mixer, the at least one modulator weight of each mixer element based on at least one of a resistor value, widths of current sourcing transistors, and widths of input differential pair transistors of the double-balanced Gilbert mixer.

14. The system of claim 13 wherein the three phase-offset signals include a first signal $B_{0°}$ offset by 0 degrees, a second signal $B_{60°}$ offset by 60 degrees, and a third signal $B_{120°}$ offset by 120 degrees.

15. The system of claim 14 wherein the four phase-offset signals include a fourth signal $C_{0°}$ offset by 0 degrees, a fifth signal $C_{90°}$ offset by 90 degrees, a sixth signal $C_{45°}$ offset by 45 degrees, and a seventh signal $C_{-45°}$ offset by −45 degrees.

16. The system of claim 15 wherein the four phase-offset signals are generated from the three phase-offset signals according to the following equations:

$$C_{0°}(t)=\sqrt{3}B_{0°}(t)+\sqrt{3}B_{60°}(t)$$

$$C_{90°}(t)=-B_{0°}(t)+B_{60°}(t)+2B_{120°}(t)$$

$$C_{45°}(t)=(\sqrt{3}-1)B_{0°}(t)+(\sqrt{3}+1)B_{60°}(t)+2B_{120°}(t)$$

$$C_{-45°}(t)=(\sqrt{3}+1)B_{0°}(t)+(\sqrt{3}-1)B_{60°}(t)-2B_{120°}(t).$$

17. The system of claim 15 implemented in a receiver having an input signal, RF(t), and at least two output signals, I(t) and Q(t), and the harmonic rejection mixer generates the output signals I(t) and Q(t) according to the following equations:

$$I(t)=[\sqrt{3}B_{0°}(t)+\sqrt{3}B_{60°}(t)]RF(t)$$

$$Q(t)=[-B_{0°}(t)+B_{60°}(t)+2B_{120°}(t)]RF(t).$$

18. The system of claim 13 implemented in at least one of a transmitter and a receiver.

* * * * *